(12) United States Patent
Riley et al.

(10) Patent No.: US 10,825,948 B1
(45) Date of Patent: *Nov. 3, 2020

(54) DIFFUSION BOND OF METALLIC LAYERS IN MULTIJUNCTION SOLAR CELLS

(71) Applicant: SolAero Technologies Corp., Albuquerque, NM (US)

(72) Inventors: Michael Riley, Los Lunas, NM (US); Mark Stan, Albuquerque, NM (US); Arthur Cornfeld, Sandy Springs, GA (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/239,098

(22) Filed: Jan. 3, 2019

Related U.S. Application Data

(60) Division of application No. 15/221,115, filed on Jul. 27, 2016, now Pat. No. 10,211,361, which is a continuation-in-part of application No. 14/674,627, filed on Mar. 31, 2015, now Pat. No. 10,008,623, which is a division of application No. 13/547,334, filed on Jul. 12, 2012, now Pat. No. 9,018,519, which is a continuation-in-part of application No. 12/401,189, filed on Mar. 10, 2009, now abandoned.

(51) Int. Cl.
*H01L 31/18* (2006.01)
*H01L 31/0216* (2014.01)

(52) U.S. Cl.
CPC ...... *H01L 31/184* (2013.01); *H01L 31/02167* (2013.01)

(58) Field of Classification Search
None
See application file for complete search history.

(56) References Cited

U.S. PATENT DOCUMENTS

| | | | |
|---|---|---|---|
| 5,882,956 A * | 3/1999 | Umehara | H01L 21/304 438/114 |
| 2004/0166681 A1* | 8/2004 | Iles | H01L 31/0687 438/689 |

* cited by examiner

*Primary Examiner* — Shannon M Gardner

(57) ABSTRACT

A solar cell comprising an epitaxial sequence of layers of semiconductor material forming a solar cell deposited using an MOCVD reactor; a metal layer disposed on top of the sequence of layers of semiconductor material, the metal layer including a top surface layer composed of gold or silver; a polymer film; depositing a first metallic adhesion layer disposed on the polymer film that has a coefficient of thermal expansion substantially different from that of the top surface layer on one surface of the polymer film; a second metallic adhesion layer deposited over the first metallic adhesion layer and having a different composition from the first metallic adhesion layer and having no chemical elements in common; and the second metallic adhesion layer of the polymer film being permanently bonded to the metal layer of the sequence of layers of semiconductor material by a thermocompressive diffusion bonding technique.

9 Claims, 3 Drawing Sheets

DIFFUSION BOND OF METALLIC LAYERS IN MULTIJUNCTION SOLAR CELLS

REFERENCE TO RELATED APPLICATIONS

This application is a divisional of U.S. patent application Ser. No. 15/221,115 filed Jul. 27, 2016, which in turn is a continuation-in-part of U.S. patent application Ser. No. 14/674,627, filed Mar. 31, 2015, now U.S. Pat. No. 10,008,623, which in turn is a division of U.S. patent application Ser. No. 13/547,334, now U.S. Pat. No. 9,018,519, which in turn was a continuation-in-part of application Ser. No. 12/401,189, filed Mar. 10, 2009, now abandoned.

All of the above related applications are incorporated herein by reference in their entirety.

GOVERNMENT RIGHTS STATEMENTS

This invention was made with government support under Contract No. NRO000-11-C-0585, awarded by the National Reconnaissance Office (NRO). The Government has certain rights in the invention.

BACKGROUND OF THE INVENTION

1. Field of the Invention

The present invention relates to the field of semiconductor devices and in particular to fabrication and bonding processes for semiconductor devices such as multijunction solar cells based on III-V semiconductor compounds.

2. Description of the Related Art

In the manufacture of certain semiconductor devices, e.g., inverted metamorphic multijunction ("IMM") solar cells based on III-V compounds, semiconductor fabrication is followed by bonding and lift off/separation processes. In a typical fabrication process, a sequence of epitaxial semiconductor layers are deposited on a growth substrate, using a technique such as metal organic chemical vapor deposition ("MOCVD"), and a metal contact layer is deposited on top of the semiconductor layer sequence. In the bonding process, a supporting film and/or surrogate substrate is typically bonded to the metal contact layer, while in the lift off/separation process, the growth substrate is removed from the semiconductor layer assembly, typically using a combined mechanical and chemical process.

Known bonding processes, as used in the manufacture of IMM solar cells, include those that rely on an epoxy-type adhesive applied between the top metal contact layer and a supporting film. Known lift/off separation processes, as also used in the manufacture of IMM solar cells, include those based on preferential chemical dissolution of a sacrificial separation layer deposited between growth substrate and semiconductor layers, while simultaneously mechanically separating the supporting film/semiconductor layer assembly from the growth substrate. See, e.g., U.S. Pat. No. 8,778,199 (Cornfeld et al.).

Whichever combination of manufacturing methods and processes are used, the bonding processes must imbue sufficient mechanical integrity for the assembly to withstand the lift-off/separation process and, ultimately, must lead to a semiconductor device having mechanical properties suitable for its intended applications.

SUMMARY OF THE INVENTION

Briefly, and in general terms, the present invention provides a method of manufacturing a solar cell comprising: providing a first semiconductor substrate with an epitaxial sequence of layers of semiconductor material forming a solar cell deposited over the first semiconductor substrate using an MOCVD reactor; depositing a metal layer on top of the sequence of layers of semiconductor material, the metal layer including a top surface layer composed of gold or silver; providing a polymer film; depositing a first metallic adhesion layer that has a coefficient of thermal expansion substantially different from that of the top surface layer on one surface of the polymer film; depositing a second metal adhesion layer over the first metallic adhesion layer and having a different composition from the first layer and having no chemical elements in common; and adjoining the second adhesion layer of the polymer film to the metal layer of the sequence of layers and permanently bonding it thereto by a thermocompressive diffusion bonding technique.

In some embodiments, there further comprises removing the first semiconductor substrate.

In some embodiments, the first metal adhesion layer comprises Cr, Ir, Ni, Mo or W.

In some embodiments, the second metal adhesion layer comprises gold.

In some embodiments, the polymer film comprises Kapton, i.e., a poly (4,4'-oxydiphenylene-pyromellitimide) material.

In some embodiments, the epitaxial sequence of layers of semiconductor material include an upper first solar subcell having a first band gap adjacent to the first semiconductor substrate; a second solar subcell adjacent to said first solar subcell and having a second band gap smaller than said first band gap; a third solar subcell adjacent to said second solar subcell and having a third band gap smaller than said second band gap; a graded interlayer adjacent to said third solar subcell, said second graded interlayer having a fourth band gap greater than said third band gap; and a lower fourth solar subcell adjacent to said graded interlayer, said lower subcell having a fifth band gap smaller than said third band gap such that said fourth subcell is lattice mismatched with respect to said third subcell.

In some embodiments, there further comprises a separation layer deposited over the first semiconductor substrate and between the first semiconductor substrate and the epitaxial sequence of layers of semiconductor material forming a solar cell.

In some embodiments, the removing step includes immersing the assembled body in hydrofluoric acid.

In some embodiments, the thermocompressive diffusion bonding includes using pressure in the range of 0.5 to 2.0 MPa at a temperature in the range of 150 to 300 degrees Centigrade for a time period between five and thirty minutes.

In some embodiments, the polymer film is corona or plasma treated to improve metal adhesion.

In some embodiments, there further comprises bonding the second surface of the polymer film to a supporting substrate utilizing a polymeric bond or a diffusion bond.

Additional aspects, advantages, and novel features of the present invention will become apparent to those skilled in the art from this disclosure, including the following detailed description as well as by practice of the invention. While the invention is described below with reference to illustrative embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

The invention will be better and more fully appreciated by reference to the following detailed description when considered in conjunction with the accompanying drawings, wherein.

DESCRIPTION OF THE INVENTION

Figure 1:
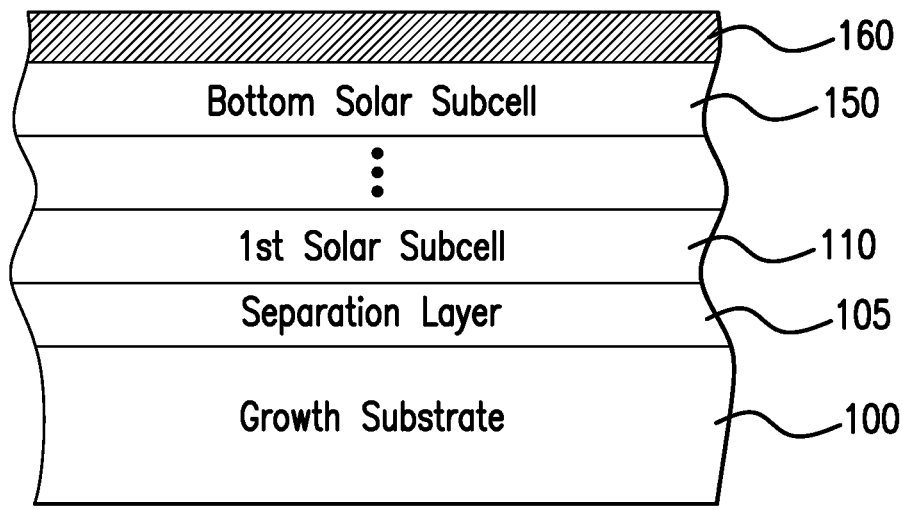
FIG. 1 is a cross-sectional view of an IMM solar cell of the invention after deposition of a top metal layer onto a sequence of epitaxial layers deposited on a first semiconductor substrate.

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

FIG. 1 is a schematic depiction of a stage in the manufacturing of a solar cell according to the invention, after deposition in an MOCVD reactor of a sequence of epitaxial semiconductor layers on first semiconductor growth substrate 100. The growth substrate may be GaAs, including the off-cut substrates described U.S. Patent Application Pub. No. 2009/0229662 A1 (Stan et al.), Ge or other suitable materials, including those described in U.S. Pat. No. 7,785,989 (Sharps et al.).

FIG. 1 shows a portion of the sequence of solar subcells and other features relevant to the present disclosure. In particular, in one embodiment, FIG. 1 shows a separation layer 105 deposited on first growth substrate 100, a first solar subcell 110 deposited on separation layer 105, a bottom solar subcell 150 deposited on a sequence of epitaxial semiconductor layers not shown in FIG. 1, and a metal layer 160 deposited on bottom solar subcell 150.

In FIG. 1, the location of the omitted solar subcells and epitaxial semiconductor layers is indicated by the vertical ellipses between bottom solar subcell 150 and first solar subcell 110. Not shown in FIG. 1 is a top surface metal layer composed of, e.g., gold or silver, included in metal layer 160.

An embodiment of an IMM solar cell grown by MOCVD according to the invention may include a variety of different configurations of the solar subcells that are formed sequentially on the semiconductor growth substrate. For example, the solar subcells may be configured in the following sequence: adjacent to the first semiconductor (or growth) substrate, an upper first solar subcell having a first band gap; adjacent to the first upper solar subcell, a second solar subcell having a second band gap smaller than the first band gap; adjacent to the second solar subcell, a third solar subcell having a third band gap smaller than the second band gap; adjacent to the third solar subcell, a graded interlayer having a fourth band gap greater than the third band gap; and, adjacent to the graded interlayer, a lower fourth (or "bottom") solar subcell, having a fifth band gap smaller than the third band gap, the fourth subcell being lattice mismatched with respect to the third subcell.

The above-described subcell sequence may include an optional separation layer disposed between the growth substrate and the first upper solar subcell, e.g., of the type represented in FIG. 1 by separation layer 105.

Figure 2A:
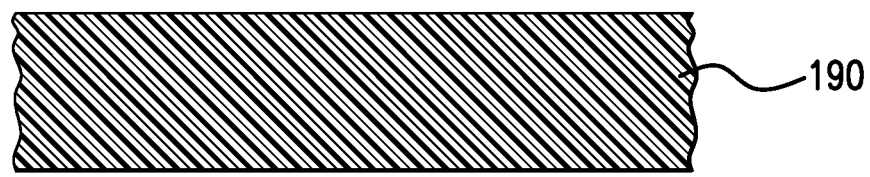
FIG. 2A is a cross-sectional view of a polymer film of the invention.

FIG. 2A is a schematic depiction of polymer film 190, may be comprised of a KAPTON® layer, that is, a polyimide film layer. KAPTON® is a trademark of E.I. du Pont de Nemours and Company. The chemical name for KAPTON® is poly (4,4'-oxydiphenylene-pyromellitimide). Other polyimide film sheets or layers may be used. The film 190 may be corona or plasma treated to improve metal adhesion.

Figure 2B:
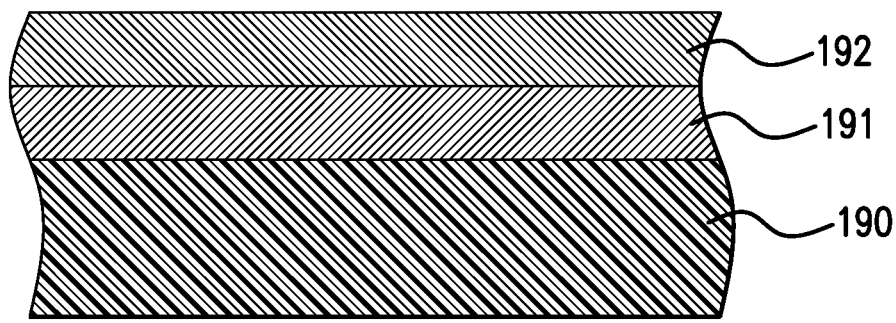
FIG. 2B is a cross-sectional view of a polymer film of the invention after deposition of a first and second metal adhesion layer.

FIG. 2B shows polymer film 190 of FIG. 2A, after deposition on one of its surfaces of a first metal adhesion layer 191 and a second metal adhesion layer 192 over first metallic adhesion layer 191. The composition of first metallic adhesion layer 191 is selected to give a coefficient of thermal expansion that is substantially different from that of the top layer of metal layer 160 deposited on bottom solar subcell 150 (as shown in FIG. 1). The composition of second metal adhesion layer 192 is selected to be different from the composition of the first metal adhesion layer 191, such that first and second metal adhesion layers have no chemical elements in common. For example, the first metal adhesion layer 191 can be comprised of Cr, Ir, Ni, Mo, or W, and the second metal adhesion layer 192 can be comprised of Au.

Figure 3:
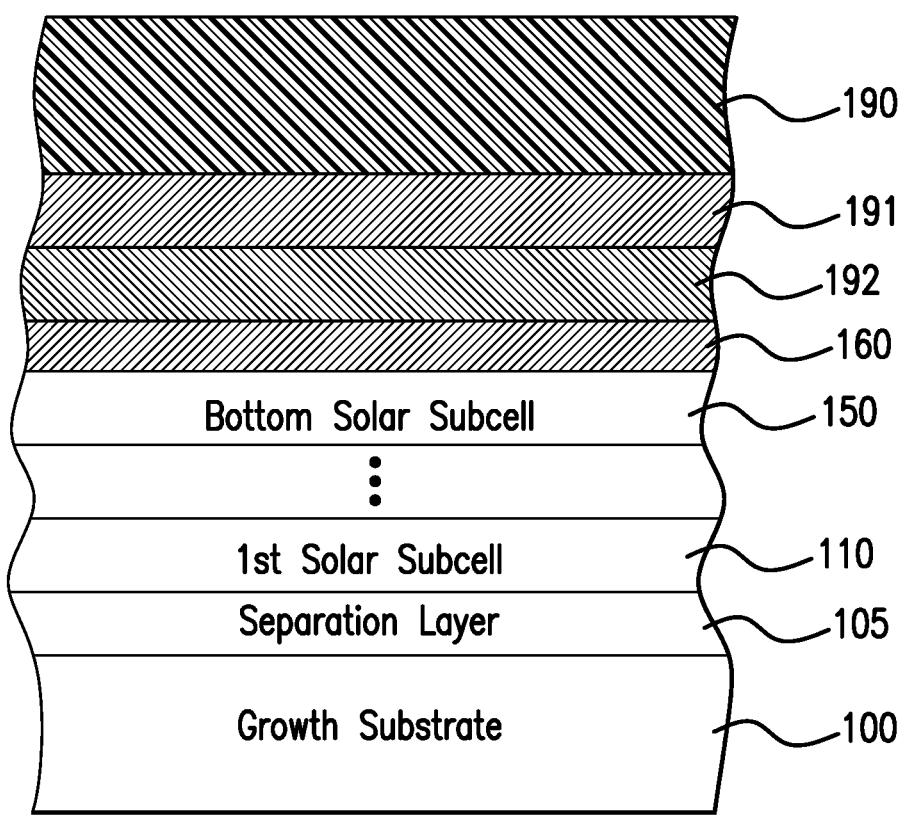
FIG. 3 is a cross-sectional view of the polymer film of FIG. 2B and solar cell of FIG. 1 after adjoining the second metal adhesion layer of the polymer film to the top metal layer of the IMM solar cell.

FIG. 3 shows the solar cell of FIG. 1 and polymer film of FIG. 2B, after adjoining metal layer 160 of the solar cell to the second metal adhesion layer 192 of the polymer film and after permanent bonding of metal layer 160 to second metal adhesion layer 192. Such permanent bonding can be achieved using thermocompressive diffusion bonding, performed, e.g., at a pressure in the range of 0.5 to 2.0 MPa at a temperature in the range of 150 to 300 degrees Centigrade for a time period between five and thirty minutes. Other suitable methods for permanently bonding metal layer 160 to second metal adhesion layer 192 may be used as well.

Figure 4:
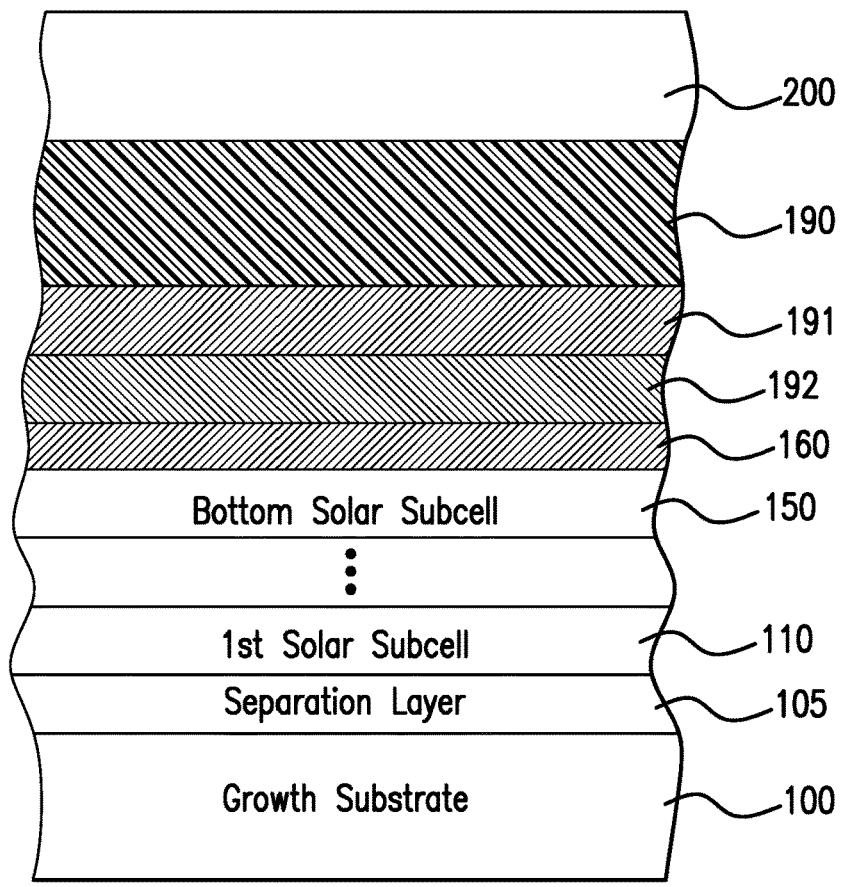
FIG. 4 is a cross-sectional view of the IMM solar cell assembly of FIG. 3 after bonding a second supportive substrate to the polymer film.

FIG. 4 shows the IMM solar cell assembly of FIG. 3, after bonding a second supporting substrate 200 to the second surface of polymer film 190 utilizing a polymeric bond or a diffusion bond. Supporting substrate 200 may be composed of any material with suitable mechanical, adhesive and other properties, for example, sapphire, Ge, GaAs or Si having an appropriate thickness.

Figure 5:
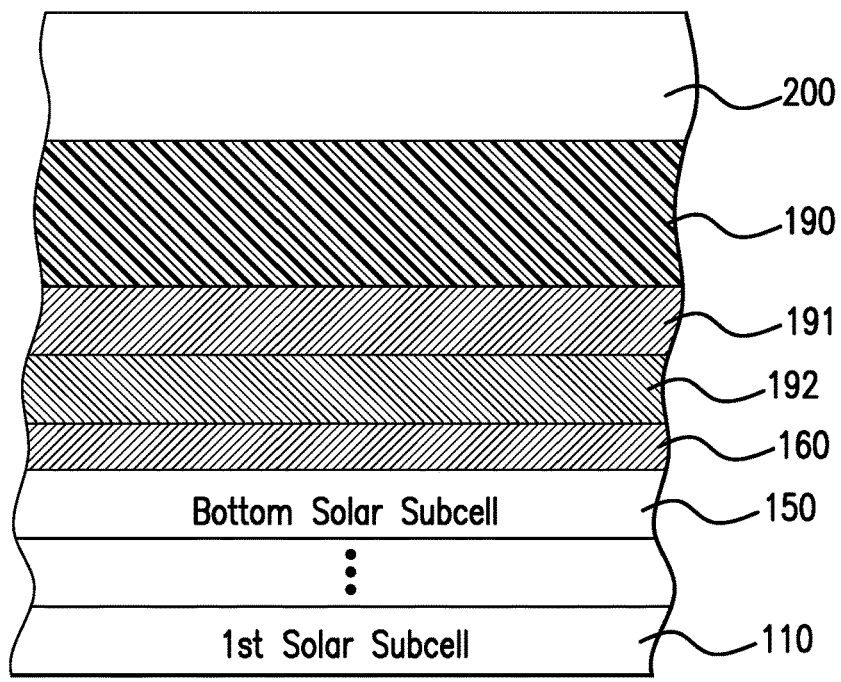
FIG. 5 is a cross-sectional view of the IMM solar cell assembly of FIG. 4 after removing the first semiconductor substrate.

FIG. 5 shows the solar cell/polymer film assembly of FIG. 3, after removing the first semiconductor growth substrate 100 and optional separation layer 105. A suitable method for removing the growth substrate is immersion of the assembly in hydrofluoric acid, which preferentially attacks at least a portion of the separation layer 105. Suitable separation layers and lift-off techniques are described in, for example, U.S. Pat. No. 8,778,199 (Cornfeld et al.).

While the invention has been illustrated and described as embodied in an IMM solar cell, it is not intended to be limited to the details shown, since various modifications and structural changes may be made without departing in any way from the spirit of the present invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

The invention claimed is:

1. A solar cell comprising:
   an epitaxial sequence of layers of semiconductor material forming a solar cell deposited using an MOCVD reactor;
   a metal layer disposed on top of the sequence of layers of semiconductor material forming the solar cell, the metal layer including a top surface layer composed of gold or silver;
   a polymer film having a first metallic adhesion layer on one surface of the polymer film, the first metallic adhesion layer having a coefficient of thermal expansion substantially different from that of the top surface layer of the metal layer of the solar cell;
   a second metallic adhesion layer disposed on the first metallic adhesion layer, the second metal adhesion layer having a different composition from the first metallic adhesion layer and having no chemical elements in common with the first metallic adhesion layer;
   wherein the second metallic adhesion layer of the polymer film is adjoined and bonded to the metal layer on top of the sequence of layers, the second metal adhesion layer being permanently bonded to the metal layer on top of the sequence of layers by diffusion of a chemical element of one layer into the other layer under thermocompression of the semiconductor substrate and the polymer film.

2. A solar cell as defined in claim 1, wherein the first metallic adhesion layer comprises Cr, Ir, Ni, Mo, or W.

3. A solar cell as defined in claim 1, wherein the second metallic adhesion layer comprises gold.

4. A solar cell as defined in claim 1, wherein the polymer film comprises a poly (4,4'-oxydiphenylene-pyromellitimide) material.

5. A solar cell as defined in claim 1, wherein the epitaxial sequence of layers of semiconductor material include an upper first solar subcell having a first band gap adjacent to the first semiconductor substrate; a second solar subcell adjacent to said first solar subcell and having a second band gap smaller than said first band gap; a third solar subcell adjacent to said second solar subcell and having a third band gap smaller than said second band gap; a graded interlayer adjacent to said third solar subcell, said second graded interlayer having a fourth band gap greater than said third band gap; and a lower fourth solar subcell adjacent to said graded interlayer, said lower subcell having a fifth band gap smaller than said third band gap such that said fourth subcell is lattice mismatched with respect to said third subcell.

6. A solar cell as defined in claim 1, further comprising a semiconductor substrate and a separation layer deposited over the semiconductor substrate between the semiconductor substrate and the epitaxial sequence of layers of semiconductor material forming a solar cell.

7. A solar cell as defined in claim 1, wherein the thermocompressive diffusion bonding includes using pressure in the range of 0.5 to 2.0 MPa at a temperature in the range of 150 to 300 degrees Centigrade for a time period between five and thirty minutes.

8. A solar cell as defined in claim 1, wherein the polymer film is corona or plasma treated to improve metal adhesion.

9. A solar cell as defined in claim 1, wherein a second surface of the polymer film is bonded to a supporting substrate utilizing a polymeric bond or a diffusion bond.

* * * * *